(12) United States Patent
Ding et al.

(10) Patent No.: US 9,713,252 B2
(45) Date of Patent: Jul. 18, 2017

(54) CERAMIC INSULATOR FOR ELECTRONIC PACKAGING AND METHOD FOR FABRICATING THE SAME

(71) Applicant: HE BEI SINOPACK ELECTRONIC TECH CO., LTD., Shijiazhuang, Hebei Province (CN)

(72) Inventors: Fei Ding, Shijiazhuang (CN); Linjie Liu, Shijiazhuang (CN); Lei Zhang, Shijiazhuang (CN)

(73) Assignee: HE BEI SINOPACK ELECTRONIC TECH CO., LTD., Shijiazhuang, Hebei Province (CN)

( * ) Notice: Subject to any disclaimer, the term of this patent is extended or adjusted under 35 U.S.C. 154(b) by 0 days.

(21) Appl. No.: 15/141,997

(22) Filed: Apr. 29, 2016

(65) Prior Publication Data
US 2017/0135204 A1 May 11, 2017

(30) Foreign Application Priority Data
Nov. 10, 2015 (CN) .......................... 2015 1 0759131

(51) Int. Cl.
*H05K 1/09* (2006.01)
*H05K 1/03* (2006.01)
(Continued)

(52) U.S. Cl.
CPC ......... *H05K 1/0306* (2013.01); *H05K 1/0213* (2013.01); *H05K 1/0298* (2013.01);
(Continued)

(58) Field of Classification Search
CPC H05K 1/02; H05K 1/16; H05K 1/162; H05K 1/165; H05K 1/167; H05K 1/271; H05K 3/34; H05K 3/40; H05K 3/4061; H01L 21/02; H01L 21/48; H01L 23/48; H01L 23/52; H01L 23/58; H01L 23/66
USPC ........ 174/251, 250, 255–257, 262; 29/25.42, 29/602.1, 607; 333/185, 204, 247; 257/664, 668, 697, 700, 728; 361/306.3
See application file for complete search history.

(56) References Cited

U.S. PATENT DOCUMENTS 4,650,923 A * 3/1987 Nishigaki ............. C04B 35/111
174/255
5,387,888 A * 2/1995 Eda ......................... H01L 23/66
257/664
(Continued)

*Primary Examiner* — Xiaoliang Chen
(74) *Attorney, Agent, or Firm* — Rankin, Hill & Clark LLP

(57) ABSTRACT

The present invention discloses a ceramic insulator for electronic packaging and a method for fabricating the same, and relates to a technical field of outer shell packaging of electronic devices. Under the circumstance of using neither a chemical coating nor any bonding wire connection circuit, through a design that builds a electroplated circuit into the ceramic insulator, the method accomplishes coating of a nickel alloy protection layer onto a porcelain by an electroplating method, so that not only quality of a coating layer but also requirement of a complete appearance can be ensured. All circuits of the ceramic insulator fabricated by the aforesaid method can conduct with external circuits, such that the electroplating method can be used to accomplish coating of the nickel alloy layer, after accomplishment of all metal coating, metallization parts on an end surface of the porcelain is removed.

5 Claims, 4 Drawing Sheets

(51) Int. Cl.
  *H05K 1/02*  (2006.01)
  *H05K 1/11*  (2006.01)
  *H05K 3/00*  (2006.01)
  *H05K 3/18*  (2006.01)
  *H05K 3/40*  (2006.01)

(52) U.S. Cl.
  CPC ............ *H05K 1/112* (2013.01); *H05K 3/005* (2013.01); *H05K 3/188* (2013.01); *H05K 3/40* (2013.01); *H05K 3/4038* (2013.01); *H05K 2201/09218* (2013.01)

(56) References Cited

U.S. PATENT DOCUMENTS

| | | | | |
|---|---|---|---|---|
| 5,464,950 | A * | 11/1995 | Horiuchi | H01L 21/4857 174/250 |
| 5,592,134 | A * | 1/1997 | Ogata | C04B 35/491 333/185 |
| 6,217,990 | B1 * | 4/2001 | Asai | H01L 23/49822 257/668 |
| 6,223,422 | B1 * | 5/2001 | Takeuchi | H01F 41/043 29/602.1 |
| 2002/0005295 | A1 * | 1/2002 | Mizutani | H05K 1/162 174/262 |
| 2002/0011907 | A1 * | 1/2002 | Yamada | H01L 23/5385 333/204 |
| 2002/0014691 | A1 * | 2/2002 | Yoon | H01L 23/49811 257/697 |
| 2004/0184219 | A1 * | 9/2004 | Otsuka | H01L 23/49805 361/306.3 |
| 2010/0095498 | A1 * | 4/2010 | Aoki | H01G 4/012 29/25.42 |
| 2016/0042860 | A1 * | 2/2016 | Choi | H01F 17/0013 336/200 |

\* cited by examiner

CERAMIC INSULATOR FOR ELECTRONIC PACKAGING AND METHOD FOR FABRICATING THE SAME

TECHNICAL FIELD

The present application relates to the technical field of outer shell packaging of electronic components, and more particularly, relates to a ceramic feedthrough insulator for electronic packaging and a method for fabricating the ceramic insulator.

BACKGROUND

A ceramic insulator is the most important component in a ceramic metal packaging outer shell, and is widely used in the photo-electronic communication field. Regarding to a ceramic insulator with a step-shaped double-deck bonding pad structure, an upper layer of the ceramic insulator is an electric control layer, a lower layer of the ceramic insulator is a RF (Radio Frequency) layer, and both the upper and lower layers need to be coated with nickel-gold protection layers so as to enhance the reliability of their structures and electrical properties.

Currently, there are two methods for coating metal onto a ceramic insulator with the aforesaid structure: 1) after coating of a nickel layer on exposed metal parts of a porcelain (ceramic) is realized by a chemical deposition method, the porcelain (ceramic) is assembled with metal components by brazing; afterwards, the disconnected circuits are connected to be conductive by a gold wire ball welding bonding wire method, and then nickel-gold electroplating is performed; after coating of a nickel-gold layer is entirely finished, metal strips are shoveled off; 2) no bonding wire is formed, and the coating of the nickel-gold layer is realized by a chemical coating method.

However, after the electroplating is realized by the connection using the bonding wires, the metal strips need to be shoveled; thus, it is inevitable to remain shoveling traces on the circuits, and thereby affect appearance and reliability of the porcelain (ceramic). In addition, compared with the electroplating method, the adoption of the chemical coating method may result in relatively lower coating layer density and bonding strength, and can't meet ever-increasing requirements of high-performance products.

CONTENTS OF THE INVENTION

A technical problem to be solved by the present invention is to provide a ceramic insulator for electronic packaging and a method for fabricating the ceramic insulator; under the circumstance of using neither chemical coating nor any bonding wire connection circuit, through a design that builds an electroplated circuit in a ceramic insulator, the method accomplishes coating of a nickel alloy protection layer onto a porcelain by adopting an electroplating method, so that not only quality of a coating layer but also requirement of a complete appearance can be ensured, and overall performance of the porcelain can be improved.

In order to solve the aforesaid technical problem, a technical solution adopted by the present invention is that: a ceramic insulator for electronic packaging comprises a first ceramic layer, a second ceramic layer, an intermediate ceramic component layer, and a third ceramic layer arranged from top to bottom; an upper surface of the first ceramic layer is provided with an upper electric control layer, the upper electric control layer comprises a plurality of first metal strips of which the number is equal to the number of bonding pads of the insulator, the first metal strips are insulated from and not interconnected with each other, parts of the first ceramic layer which correspond to positions of the bonding pads of the insulator are provided with a plurality of first via holes, each of the first via holes is provided therein with a first connecting metal wire, the first connecting metal wires correspond to the first metal strips one to one and are interconnected; an upper surface of the second ceramic layer is provided with an upper electroplating wire layer, the upper electroplating wire layer comprises a plurality of second metal strips, the second metal strips correspond to the first connecting metal wires one to one and are interconnected, a left side and a right side of the second ceramic layer are respectively provided with a plurality of second via holes, each of the second via holes is provided therein with a second connecting metal wire, the second connecting metal wires correspond to the second metal strips one to one and are interconnected; a left side and a right side of the intermediate ceramic component layer are respectively provided with a plurality of third via holes, positions of the third via holes correspond to positions of the second via holes one to one, each of the third via holes is provided therein with a third connecting metal wire, the third connecting metal wires correspond to the second connecting metal wires one to one and are interconnected; an upper surface of the third ceramic layer is provided with a lower electroplating wire layer, the lower electroplating wire layer comprises a plurality of third metal strips, the third metal strips are insulated from and not interconnected with each other, the third metal strips correspond to the third connecting metal wires one to one and are interconnected, and one end of each of the third metal strips extends to an edge of the third ceramic layer, such that electric connections between the third metal strips and device(s) at the exterior of the porcelain can be realized.

A further technical solution is that: the intermediate ceramic component layer comprises a fourth ceramic layer, a fifth ceramic layer and a sixth ceramic layer, an upper surface of the fourth ceramic layer is provided with a upper GND layer, an upper surface of the fifth ceramic layer is provided with an RF layer, an upper surface of the sixth ceramic layer is provided with a lower GND layer, the upper GND layer, the RF layer and the lower GND layer are insulated from and not interconnected with the third connecting metal wires.

A further technical solution is that: the RF layer comprises a plurality of fourth metal strips, two ends of each of the fourth metal strips extends to an outside of the fifth ceramic layer, such that electric connections between the fourth metal strips and devices at the exterior of the porcelain is realized.

A further technical solution is that: each of the upper GND layer and the lower GND layer comprises a piece of metal electrode, the metal electrodes are interconnected with the GND metal strips in the RF layer by means of metallization of the interlayer via holes, such that the upper GND layer and the lower GND layer can be electrically connected with the GND circuits of the RF layer.

A further technical solution is that: an upper surface of the first ceramic layer is provided with a structural beam.

The present invention further discloses a method for fabricating a ceramic insulator for electronic packaging, comprising following steps:

first, punching holes at positions of bonding pads of a first ceramic layer of a ceramic insulator, metallizing and solidifying the holes, after the metallization and solidification, printing an upper electric control layer circuit, wherein the upper electric control layer circuit comprises a plurality of metal strips, the metal strips are insulated from and not interconnected with each other, but the metal strips correspond to metal in the holes one to one and are interconnected with the metal in the holes;

second, using an underside of the first ceramic layer as a second ceramic layer, punching two groups of holes respectively on two sides of the second ceramic layer corresponding to the holes of the first ceramic layer, metallizing and solidifying the holes of the second ceramic layer, such that the total number of the holes at the two sides of the second ceramic layer is equal to the number of the holes at the first ceramic layer;

third, printing an upper electroplating circuit layer on an upper surface of the second ceramic layer, wherein the upper electroplating circuit layer comprises a plurality of metal strips, via the printed metal strips, connecting the metal in the holes at the two sides of the second ceramic layer with the metal in the holes at the first ceramic layer one to one, wherein the metal strips on the upper surface of the second ceramic layer are insulated from and not interconnected with each other;

four, an underside of the second ceramic layer being provided with an intermediate ceramic component layer, punching holes on two sides of the intermediate ceramic component layer, metallizing and solidifying the holes, such that positions and the number of the holes at the intermediate ceramic component layer correspond to that of the holes at the second ceramic layer;

five, an underside of the intermediate ceramic component layer being provided with a third ceramic layer, printing a lower electroplating circuit layer on an upper surface of the third ceramic layer, wherein the lower electroplating circuit layer comprises a plurality of metal strips, the metal strips are insulated from and not interconnected with each other; connecting the printed metal strips one to one with corresponding metal in the holes of the intermediate ceramic component layer, and making one end of each of the metal strips on the third ceramic layer extend to an edge of the third ceramic layer to form a leading-out terminal, such that electric connections between the third metal strips and device(s) at the exterior of the porcelain is realized; via the aforesaid steps, forming a built-in electroplating circuit of a raw porcelain.

A further technical solution is that: the intermediate ceramic component layer comprises a fourth ceramic layer, a fifth ceramic layer and a sixth ceramic layer, an upper surface of the fourth ceramic layer is provided with an upper GND layer, an upper surface of the fifth ceramic layer is provided with an RF layer, an upper surface of the sixth ceramic layer is provided with a lower GND layer, the upper GND layer, the RF layer and the lower GND layer are insulated from and not interconnected with the third connecting metal wires.

A further technical solution is that: the RF layer comprises a plurality of metal strips, two ends of each of the metal strips extend to an outer side of the fifth ceramic layer to form leading-out terminals, such that electric connections between the metal strips and device(s) in the exterior of the porcelain are realized; each of the upper GND layer and the lower GND layer comprises a piece of metal electrode, the metal electrodes and the GND metal strips in the RF layer are interconnected by means of metallization of the interlayer via holes, such that the upper GND layer and the lower GND layer can be electrically connected with the GND circuits of the RF layer.

A further technical solution is that: the method further comprises a step of metallizing the leading-out terminal of the raw porcelain.

A further technical solution is that: the method further comprises a sintering step after the step of metallizing the leading-out terminal, which is configured for sintering the raw porcelain into a ripe porcelain.

Advantageous effects generated by the aforesaid technical solutions are as follows: under the circumstance of using neither chemical coating nor any bonding wire connection circuit, through a design that builds an electroplated circuit in a ceramic insulator, the method accomplishes coating of a nickel alloy protection layer onto a porcelain by adopting an electroplating method, so that not only quality of a coating layer but also requirement of a complete appearance can be ensured. All circuits of the ceramic insulator fabricated by the aforesaid method can conduct with externals circuit, such that the electroplating method can be used to accomplish the coating of the nickel alloy layer; after accomplishment of all metal coating, metallization parts on an end surface of the porcelain is removed, in this way, not only can a complete appearance of the ceramic insulator circuits be realized, but also reliability of a structure and an electric performance of the ceramic insulator can be ensured, so that an overall performance of the porcelain can be improved.

wherein, 1: first ceramic layer; 2: second ceramic layer; 3: third ceramic layer; 4: intermediate ceramic component layer; 5: first metal strip; 6: first connecting metal wire; 7: second metal strip; 8: second connecting metal wire; 9: third connecting metal wire; 10: third metal strip; 11: fourth metal strip; 12: structural beam; 41: fourth ceramic layer; 42: fifth ceramic layer; 43: sixth ceramic layer.

DETAILED DESCRIPTION OF THE PREFERRED EMBODIMENT

Technical solutions in the embodiments of the present invention will be described clearly and in detail with reference to the accompanying drawings. It is obvious that described embodiments are only some embodiments rather than all embodiments of the present invention. Based on the embodiments of the present invention, any other embodiments obtained by the one skilled in the art on the premise of paying no creative labor should fall into the protection scope of the present invention.

In following description, many specific details are illustrated such that the present invention can be fully understood, however, the present invention can also be implemented by other methods distinguished from the method described herein, one skilled in the art can make a similar promotion under the circumstance of not departing from the connotation of the present invention, and thus the present invention is not restricted by specific embodiments disclosed in the following.

Embodiment One

Figure 1:
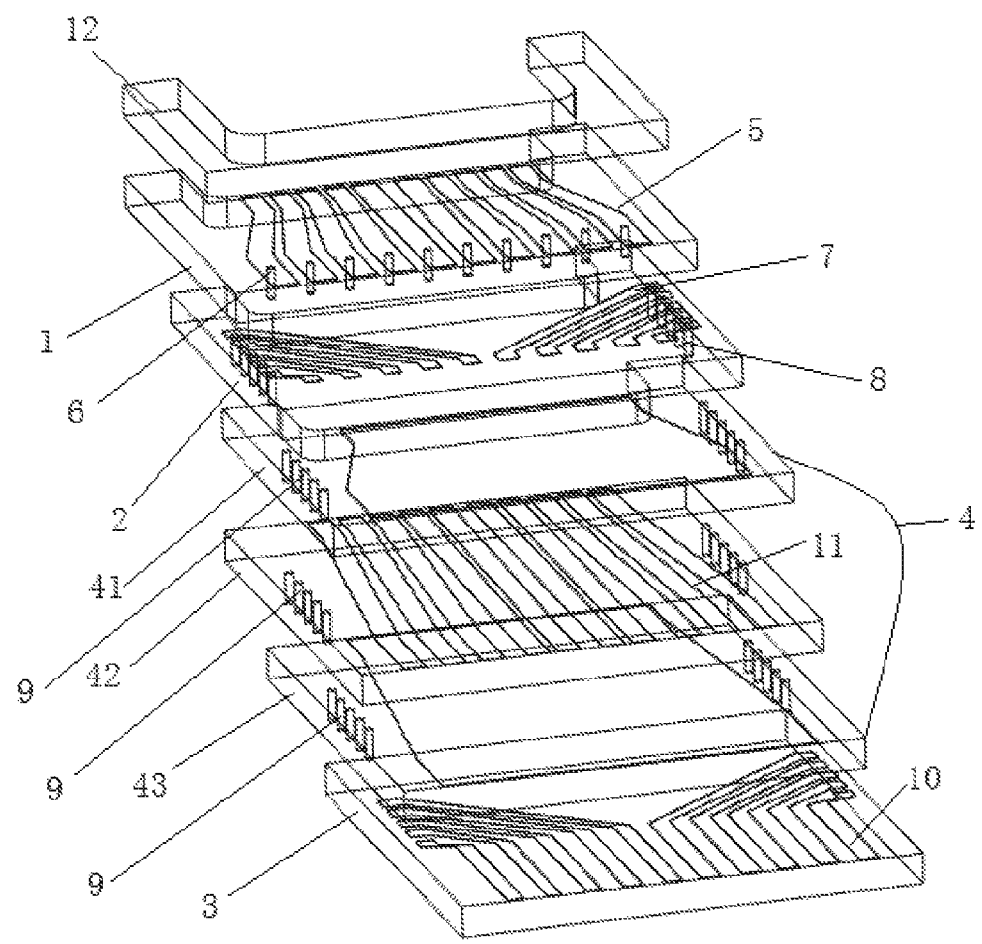
FIG. 1 illustrates a disassembled perspective structural schematic view of a ceramic insulator of the present invention.
Figure 2:
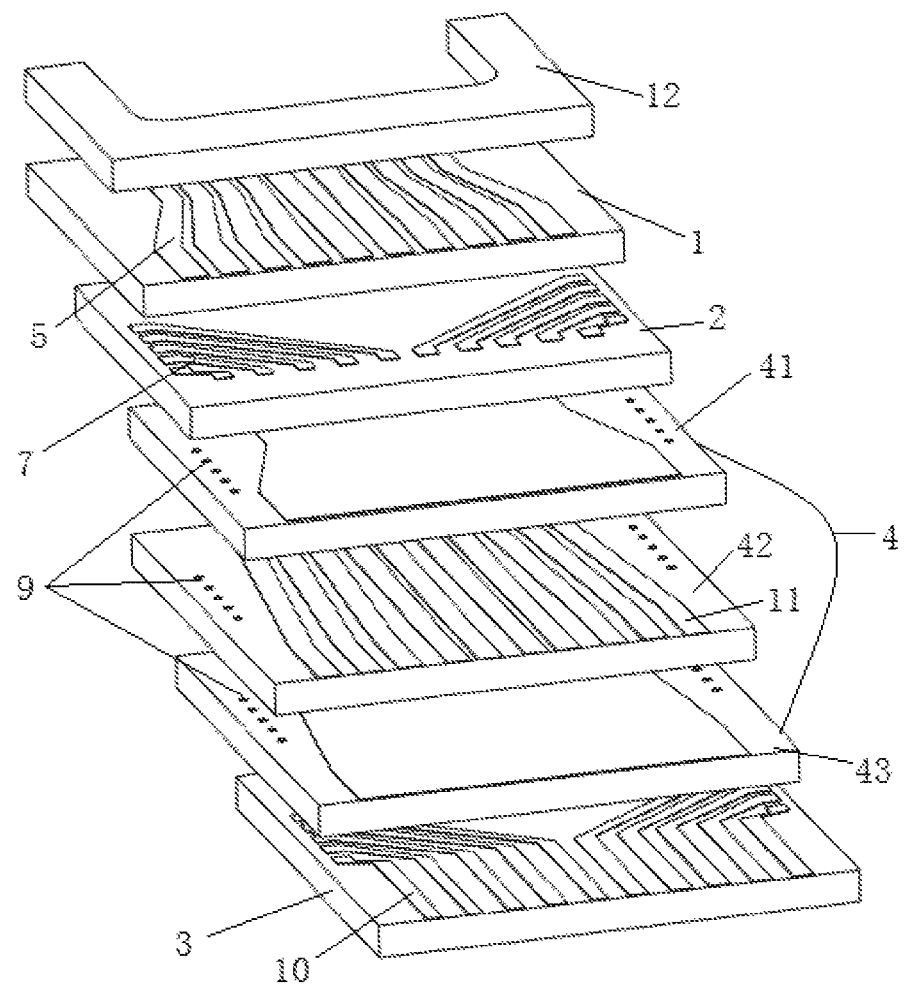
FIG. 2 illustrates a disassembled structural schematic view of the ceramic insulator of the present invention.

As shown in FIG. 1 and FIG. 2, the present invention discloses a ceramic insulator for electronic packaging, which comprises a first ceramic layer 1, a second ceramic layer 2, an intermediate ceramic component layer 4 and a third ceramic layer 3; an upper surface of the first ceramic layer 1 is provided with a structural beam 12 configured for enhancing an overall intensity of the ceramic insulator. The upper surface of the first ceramic layer 1 is provided with an upper electric control layer, the upper electric control layer comprises a plurality of first metal strips 5 of which the number is equal to the number of the bonding pads of the insulator, the first metal strips 5 are insulated from and not interconnected with each other; positions of the first ceramic layer 1 corresponding to the positions of the bonding pads of the insulator are provided with a plurality of first via holes, each the first via hole is provided therein with a first connecting metal wire 6, the first connecting metal wires 6 correspond to the first metal strips 5 one to one and are interconnected with the first metal strips 5.

An upper surface of the second ceramic layer 2 is provided with an upper electroplating circuit layer, the upper electroplating circuit layer comprises a plurality of second metal strips 7, the second metal strips 7 correspond to the first connecting metal wires 6 one to one and interconnect with the first connecting metal wires 6; a left side and a right side of the second ceramic layer 2 are respectively provided with a plurality of second via holes, each of the second via holes is provided therein with a second connecting metal wire 8, the second connecting metal wires 8 correspond to the second metal strips 7 one to one and interconnect with the second metal strips 7.

A left side and a right side of the intermediate ceramic component layer 4 are respectively provided with a plurality of third via holes, positions of the third via holes correspond to positions of the second via holes one to one, each of the third via holes is provided therein with a third connecting metal wire 9, the third connecting metal wires 9 correspond to the second connecting metal wires 8 one to one and interconnect with the second connecting metal wires 8; the intermediate ceramic component layer 4 comprises a fourth ceramic layer 41, a fifth ceramic layer 42 and a sixth ceramic layer 43, an upper surface of the fourth ceramic layer 41 is provided with an upper GND (Ground) layer, an upper surface of the fifth ceramic layer 42 is provided with an RF (Radio Frequency) layer, an upper surface of the sixth ceramic layer 43 is provided with a lower GND layer, the upper GND layer, the RF layer, and the lower GND layer are insulated from and not interconnected with the third connecting metal wires 9.

The RF layer comprises a plurality of fourth metal strips 11, two ends of each of the fourth metal strips 11 extend to an outer side of the fifth ceramic layer 42, thereby realizing electric connections between the fourth metal strips 11 and device(s) in an exterior of a porcelain. Each of the upper GND layer and the lower GND layer comprises a piece of metal electrode, the electrode is interconnected with the GND metal strips by means of metallization of the interlayer via holes (the number of the via holes are determined according to the RF performance), such that the upper GND layer and the lower GND layer can be electrically connected with the GND circuit of the RF layer.

An upper layer of the third ceramic layer 3 is provided with a lower electroplating circuit layer, the lower electroplating circuit layer comprises a plurality of third metal strips 10, the third metal strips 10 are insulated from and not interconnected with each other, the third metal strips 10 correspond to the third connecting metal wires 9 one to one and interconnect with the third connecting metal wires 9, and one end of each of the third metal strip 10 extends to an edge of the third ceramic layer 3, such that electric connections between the third metal strips 10 and device(s) in the exterior of the porcelain can be realized.

Embodiment Two

The present invention further discloses a method for fabricating a ceramic insulator for electronic packaging, which comprises the following steps:

1) punching holes at positions of bonding pads of a first ceramic layer 1 of a ceramic insulator, metallizing and solidifying the holes, afterwards, printing an upper electric control layer circuit, the upper electric control layer circuit comprises a plurality of metal strips, the metal strips are insulated from and not interconnected with each other, but the metal strips correspond to metal in the holes one to one, and interconnect with the metal in the holes;

2) using an underside of the first ceramic layer 1 as a second ceramic layer 2, punching two groups of holes respectively on two sides of the second ceramic layer 1 corresponding to positions of the holes of the first ceramic layer 1, metallizing and solidifying the holes of the second ceramic layer 2, such that the total number of the holes at the two sides of the second ceramic layer 2 is equal to the number of the holes at the first ceramic layer;

3) printing an upper electroplating circuit layer on an upper surface of the second ceramic layer 2, wherein the upper electroplating circuit layer comprises a plurality of metal strips, via the printed metal strips, connecting metal in the holes punched at the two sides of the second ceramic layer 2 one to one with corresponding metal in the holes at the first ceramic layer 1, wherein the metal strips on the upper surface of the second ceramic layer 2 are insulated from and not interconnected with each other;

4) an underside of the second ceramic layer 2 being provided with an intermediate ceramic component layer 4, punching holes on two sides of the intermediate ceramic component layer 4, metallizing and solidifying the holes, such that positions and the number of the holes at the intermediate ceramic component layer 4 correspond to that of the holes at the second ceramic layer;

5) an underside of the intermediate ceramic component layer 4 being provided with a third ceramic layer 3, printing a lower electroplating circuit layer on an upper surface of the third ceramic layer 3, the lower electrodesposition circuit layer comprises a plurality of metal strips, the metal strips are insulated from and not interconnected with each other; connecting the printed metal strips one to one with corresponding metal in the holes of the intermediate ceramic component layer 4, and one end of each of the metal strips on the third ceramic layer 3 extends to an edge of the third ceramic layer 3 to form a leading-out terminal, such that electric connections between the third metal strips and device(s) from an external of a porcelain is realized, via the aforesaid steps, forming a built-in electroplating circuit of a raw porcelain.

In the embodiment of the present invention, the intermediate ceramic layer 4 comprises a fourth ceramic layer 41, a fifth ceramic layer 42 and a sixth ceramic layer 43. An upper surface of the fourth ceramic layer 41 is provided with an upper GND layer, an upper surface of the fifth ceramic layer 42 is provided with an RF layer, an upper layer of the sixth ceramic layer 43 is provided with a lower GND layer, the upper GND layer, the RF layer and the lower GND layer are insulated from and not interconnected with metal in the holes of the intermediate ceramic component layer 4.

In the embodiment of the present invention, the RF layer comprises a plurality of metal strips, two ends of each of the metal strips extend to an outer side of the fifth ceramic layer 42 to form leading-out terminals, such that electric connections between the metal strips and devices in the exterior of the porcelain are realized; each of the upper GND layer and the lower GND layer comprises a piece of metal electrode, the metal electrodes and the GND metal strips of the RF layer are interconnected by means of metallization of the interlayer via holes (the number of the via holes are determined by the RF performance), such that the upper GND layer and the lower GND layer can be electrically connected with the GND circuits of the RF layer can be realized.

6) metallizing the leading-out terminal of a raw porcelain.

Figure 3:
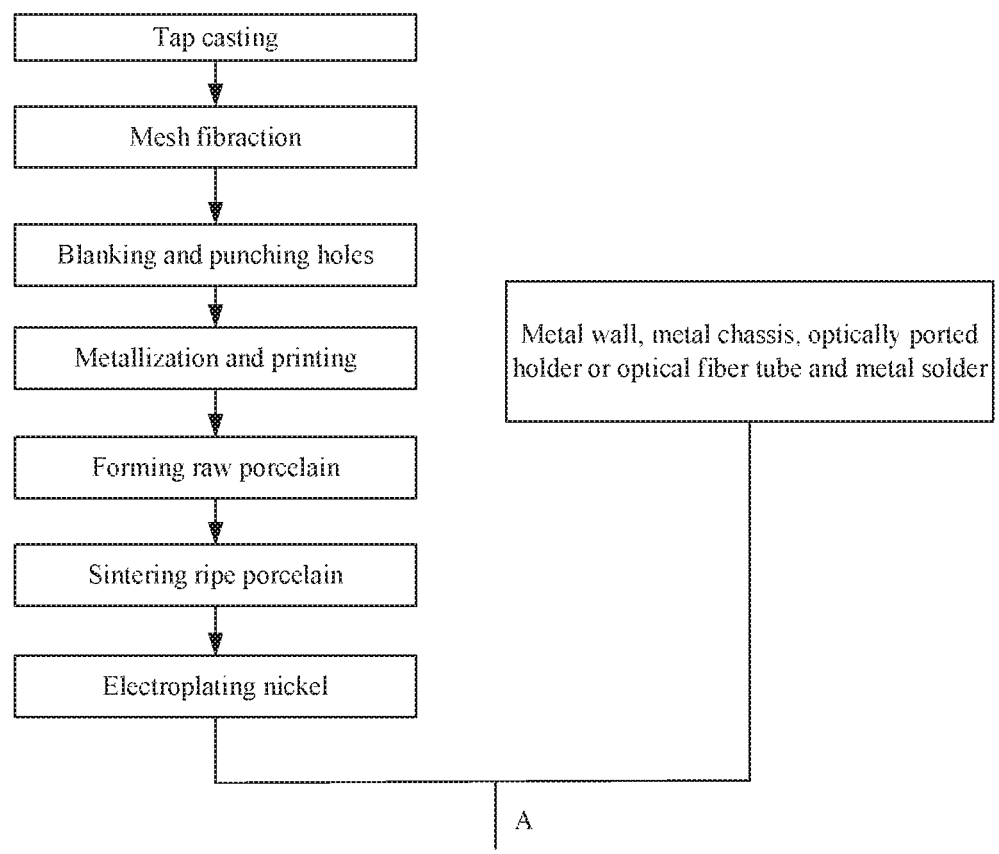
FIGS. 3 and 4 are flow diagrams of a method for fabricating the ceramic insulator of the present invention.
Figure 4:
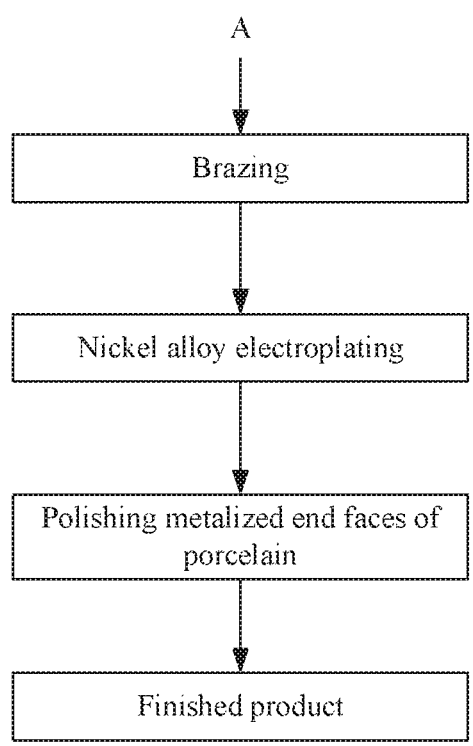

7) a sintering step configured for sintering the raw porcelain and thereby forming a ripe porcelain (regarding to the specific flow process of said method, please refer to FIG. 3 and FIG. 4, wherein a line mark A of FIG. 3 connects to a line mark A of FIG. 4 to form a whole flow chart of said method).

Under the circumstance of using neither chemical coating nor any bonding wire connection circuit, through a design that builds an electroplated circuit in a ceramic insulator, the method accomplishes coating of a nickel alloy protection layer onto a porcelain by adopting an electroplating method, so that not only quality of a coating layer but also requirement of a complete appearance can be ensured. All circuits of the ceramic insulator fabricated by the aforesaid method can conduct with external circuits, such that the electroplating method can be used to accomplish the coating of the nickel alloy layer, after accomplishment of all metal coating, metallization parts on an end surface of the porcelain is removed, in this way, not only can an integrated appearance of the ceramic insulator circuits be realized, but also reliability of a structure and an electric performance of the ceramic insulator can be ensured, so that an overall performance of the porcelain can be improved.

The invention claimed is:

1. A ceramic insulator for electronic packaging, comprising a first ceramic layer (1), a second ceramic layer (2), an intermediate ceramic component layer (4), and a third ceramic layer (3) arranged from top to bottom, an upper surface of the first ceramic layer (1) is provided with an upper electric control layer, the upper electric control layer comprises a plurality of first metal strips (5) of which the number is equal to that of bonding pads of the insulator, the first metal strips (5) are insulated from and not interconnected with each other, parts of the first ceramic layer (1) which correspond to positions of the bonding pads of the insulator are provided with a plurality of first via holes, each of the first via holes is provided therein with a first connecting metal wire (6), the first connecting metal wires (6) correspond to the first metal strips (5) one to one and are interconnected; an upper surface of the second ceramic layer (2) is provided with an upper electroplating wire layer, the upper electroplating wire layer comprises a plurality of second metal strips (7), the second metal strips (7) correspond to the first connecting metal wires (6) one to one and are interconnected, a left side and a right side of the second ceramic layer (2) are respectively provided with a plurality of second via holes, each of the second via holes is provided therein with a second connecting metal wire (8), the second connecting metal wires (8) correspond to the second metal strips (7) one to one and are interconnected; a left side and a right side of the intermediate ceramic component layer (4) are respectively provided with a plurality of third via holes, positions of the third via holes correspond to positions of the second via holes one to one, each of the third via holes is provided therein with a third connecting metal wire (9), the third connecting metal wires (9) correspond to the second connecting metal wires (8) one to one and are interconnected; an upper surface of the third ceramic layer (3) is provided with a lower electroplating wire layer, the lower electroplating wire layer comprises a plurality of third metal strips (10), the third metal strips (10) are insulated from and not interconnected with each other, the third metal strips (10) correspond to the third connecting metal wires (9) one to one and are interconnected, and one end of each of the third metal strips (10) extends to an edge of the third ceramic layer (3), such that electric connections between the third metal strips (10) and device(s) at the exterior of the porcelain can be realized.

2. The ceramic insulator used in electronic packaging according to claim 1, wherein: the intermediate ceramic component layer (4) comprises a fourth ceramic layer (41), a fifth ceramic layer (45) and a sixth ceramic layer (43), an upper surface of the fourth ceramic layer (41) is provided with an upper GND layer, an upper surface of the fifth ceramic layer (42) is provided with an RF layer, an upper surface of the sixth ceramic layer (43) is provided with a lower GND layer, the upper GND layer, the RF layer and the lower GND layer are insulated from and not interconnected with the third connecting metal wires.

3. The ceramic insulator used in electronic packaging according to claim 2, wherein: the RF layer comprises a plurality of fourth metal strips (11), two ends of each of the fourth metal strips (11) extends to an outside of the fifth ceramic layer (42), such that electric connections between the fourth metal strips (11) and devices at the exterior of the porcelain can be realized.

4. The ceramic insulator used in electronic packaging according to claim 2, wherein: each of the upper GND layer and the lower GND layer comprise a piece of metal electrode, the metal electrodes are interconnected with the GND metal strips in the RF layer by means of metallization of the interlayer via holes, such that the upper GND layer and the lower GND layer can be electrically connected with the GND circuits of the RF layer.

5. The ceramic insulator used in electronic packaging according to claim 1, wherein: an upper surface of the first ceramic layer is provided with a structural beam.

* * * * *